United States Patent [19]
Yim et al.

[11] Patent Number: 5,572,475
[45] Date of Patent: Nov. 5, 1996

[54] SENSE AMPLIFIER CONTROL CIRCUIT OF SEMICONDUCTOR MEMORY DEVICE

[75] Inventors: Sung-Min Yim, Pyeongtake-gun; Jung-Hyuck Lee, Seoul, both of Rep. of Korea

[73] Assignee: Samsung Electronics Co., Ltd., Suwon, Rep. of Korea

[21] Appl. No.: 379,693

[22] Filed: Jan. 27, 1995

[30] Foreign Application Priority Data

Jan. 27, 1994 [KR] Rep. of Korea ............... 1465/1994

[51] Int. Cl.$^6$ ............................................. G11C 7/00
[52] U.S. Cl. .................. 365/208; 365/205; 365/189.07
[58] Field of Search ............................. 365/205, 190, 365/191, 207, 208, 189.07; 327/52, 55, 57

[56] References Cited

U.S. PATENT DOCUMENTS

| | | | |
|---|---|---|---|
| 5,267,203 | 11/1993 | Hwang | 365/190 |
| 5,386,389 | 1/1995 | Taoka | 365/205 X |
| 5,420,823 | 5/1995 | Yonaga | 365/205 X |

*Primary Examiner*—David C. Nelms
*Assistant Examiner*—Son Mai
*Attorney, Agent, or Firm*—Cushman Darby & Cushman, L.L.P.

[57] ABSTRACT

The present invention relates to a semiconductor memory device and more particularly to a sense amplifier control circuit capable of stabilizing memory cell voltage characteristics by clamping an external power supply voltage to an internal power supply voltage. The semiconductor memory device according to the present invention has a sense amplifier operated by a given control signal and a first sense amplifier driver. A sense amplifier driver control circuit has an output line connected to a control terminal of the first sense amplifier driver for variably controlling current flowing into the first sense amplifier driver by allowing the amount of current to be increased when transmitting data from a RAM port to a SAM port. A bias circuit has an output line connected to a control terminal of a driving element of the sense amplifier driver control unit and maintains the current flowing into the driving element at a constant state regardless of an increment or decrement of an external power supply voltage. A drive circuit having an input line connected to a voltage applied to the sense amplifier and an output line connected to the input lines of the sense amplifier control circuit and the bias circuit drive the sense amplifier driver control circuit and the bias circuit.

19 Claims, 9 Drawing Sheets

5,572,475

SENSE AMPLIFIER CONTROL CIRCUIT OF SEMICONDUCTOR MEMORY DEVICE

BACKGROUND OF THE INVENTION

The present invention relates to a semiconductor memory device and more particularly to a sense amplifier control circuit capable of stabilizing memory cell voltage characteristics by clamping an external power supply voltage to an internal power supply voltage.

As the area occupied by a single transistor is reduced in proportion to the density of a semiconductor memory device, the size of transistor is miniaturized. If a voltage from an external power supply voltage terminal is directly applied to a small-sized sense amplifier and memory cell, the voltage characteristics of the cells is distorted. Furthermore, upon performance of a sensing operation, peak current is increased and power noise is generated, thus making it impossible to perform stabilized sensing operation of the memory device. This unstable performance is, in part, due to the fact that, in sense amplifier control circuits, the external power supply voltage is directly applied by an active restoring signal to the sense amplifier and memory cell through a sense amplifier driver transistor.

FIG. 1 is a block diagram illustrating a conventional sense amplifier control circuit classified in accordance with each function. In the figure, a dotted block illustrates a sense amplifier control circuit 50, which is comprised of a comparator 50A, a trigger circuit 50D, a level converting circuit 50B, a comparator enable device 50C, a bias circuit 50E, and a p-type sense amplifier driver control circuit 50F.

The comparator 50A inputs and compares a voltage of a p-type sense amplifier 40 of a memory cell array 100 and a reference voltage Vref and outputs the compared voltage by the control of a p-type sense amplifier control circuit enable signal φSP.

The level converting circuit 50B converts a second power supply voltage of the p-type sense amplifier control circuit enable signal φSP into a first power supply voltage. Typically, the first power supply voltage is an external power supply voltage having a potential of 5 V, and the second power supply voltage is an internal power supply voltage having a potential of 4 V.

The comparator enable device 50C enables or disables the output of the comparator 50A through the level converting circuit 50B.

The trigger circuit 50D inputs, inverts and outputs the outputs of the comparator 50A and comparator enable device 50C.

The bias circuit 50E inputs the output of the trigger circuit 50D and ensures that a current flowing into a driving element of the p-type sense amplifier driver control circuit 50F is constant. The p-type sense amplifier driver control circuit 50F inputs the outputs of the trigger circuit 50D and bias circuit 50E, outputs them to a gate terminal of a p-type sense amplifier driver 1, and then makes a flow of current of the p-type sense amplifier driver 1 constant.

FIG. 2 is a detailed circuit diagram illustrating the conventional sense amplifier control circuit of FIG. 1. FIG. 3A is diagram illustrating a circuit for generating a clock signal of FIG. 2. FIG. 3B is a timing diagram illustrating an operation of FIG. 2. FIG. 3C is a detailed timing diagram illustrating an operation of a portion of FIG. 3B.

Referring to FIG. 2, the comparator 50A comprises a first PMOS transistor 11 having a source terminal connected to an external power supply voltage terminal and a gate terminal and a drain terminal are diode-connected to each other, a second PMOS transistor 12 having a source terminal connected to the external power supply voltage terminal and a gate terminal connected to the gate terminal of the first PMOS transistor 11, a first NMOS transistor 13 having a gate terminal connected to a p-type sense amplifier enable node 2 and a drain terminal connected to the drain terminal of the first PMOS transistor 11, a second NMOS transistor 14 having a gate terminal connected to a predetermined reference voltage Vref and a drain terminal connected to the drain terminal of the second PMOS transistor 12, an output node N1 connected to a common terminal between the second PMOS transistor 12 and the second NMOS transistor 14, and a third NMOS transistor 15 having a drain terminal connected to each of source terminals of the first and second NMOS transistors 13 and 14, a gate terminal connected to the p-type sense amplifier control circuit enable signal φSP, and a source terminal connected to a ground potential terminal.

The level converting circuit 50B comprises a first PMOS transistor 19 having a source terminal connected to an external power supply voltage terminal, a second PMOS transistor 20 having a source terminal connected to an external power supply voltage terminal, a first NMOS transistor 21 having a gate terminal connected to the p-type sense amplifier control circuit enable signal φSP, a source terminal connected to a ground potential terminal, and a drain terminal connected commonly to a drain terminal of the first PMOS transistor 19 and a gate terminal of the second PMOS transistor 20, an inverter 23 having an input terminal connected to the p-type sense amplifier control circuit enable signal φSP and having an internal power supply voltage as a control input, a second NMOS transistor 22 having a source terminal connected to a ground potential terminal and a gate terminal connected to an output terminal of the inverter 23, and output node N3 connected commonly to a gate terminal of the first PMOS transistor 19 and each drain terminals of the second PMOS and NMOS transistors 20 and 22.

The comparator enable device 50C is comprised of a PMOS transistor 16 having a source terminal connected to an external power supply voltage terminal, a gate terminal connected to an output node of the level converting circuit 50B, and a drain terminal connected to the output node of the comparator 50A. The trigger circuit 50D includes a PMOS transistor 17 having a source terminal connected to an external power supply voltage and a gate terminal connected to an output node of the comparator 50A, an NMOS transistor 18 having a source terminal connected to a ground potential terminal and a gate terminal connected to the output node of the comparator 50A, and an output node N2 connected commonly to each of the drain terminals of the PMOS and NMOS transistors 17 and 18.

The bias circuit 50E includes a PMOS transistor 24 having a source terminal connected to an internal power supply voltage terminal and a gate terminal connected to a ground potential terminal, a first NMOS transistor 25 having a drain terminal connected to the drain terminal of the PMOS transistor 24 and a gate terminal connected to the output node N2 of the trigger circuit 50D, an output node as a common terminal of the PMOS and the first NMOS transistors 24 and 25, for outputting a voltage VB, and a second NMOS transistor 26 having drain and gate terminals diode-connected to the source terminal of the first NMOS transistor 25 and a source terminal connected to a ground potential terminal.

The p-type sense amplifier driver control circuit 50F is comprised of a PMOS transistor 27 having a source terminal connected to an external power supply voltage terminal and a gate terminal connected to the output node of the trigger circuit 50D, a first NMOS transistor 28 having a gate terminal connected to a first input line, an output line connecting a common terminal of the PMOS and first NMOS transistors 27 and 28 to a control terminal of the sense amplifier driver 1 and generating a p-type sense amplifier driver enable clock φPSE, a second NMOS transistor 29 having a drain terminal and a source terminal connected between the source terminal of the first NMOS transistor 28 and a ground potential terminal, and a gate terminal connected to the output node of the bias circuit 50E, and a device connected between an external power supply voltage terminal and the output line, for allowing a current iB flowing to the first and second NMOS transistors 28 and 29 to be constant. Here, the device is comprised of a first PMOS transistor 30 having a source terminal connected to the external power supply voltage terminal and gate and drain terminals diode-connected to each other, and a second PMOS transistor 31 having both terminals connected between the drain terminal of the first PMOS transistor 30 and the output line, and having a gate terminal connected to a ground potential terminal. Here, the external power supply voltage terminal outputs an external power supply voltage ext. Vcc, and the internal power supply voltage terminal outputs an internal power supply voltage int. Vcc.

A detailed description of an operation of FIG. 2 will be given with reference to FIGS. 3A to 3C.

Referring to FIG. 3A showing circuits which generate each clock signals, an n-type sense amplifier driver enable clock φNSE, as shown in (b) of FIG. 3A, is generated after a signal φS passing through a delay circuit and a master clock φR are passed through a NAND gate 4. The master clock φR is generated by a row address strobe signal $\overline{RAS}$ that is passed through inverters 1 to 3, as shown in (a) of FIG. 3A. The p-type sense amplifier control circuit enable clock φSP is generated after the n-type sense amplifier driver enable clock φNSE passing through inverters 6 to 8 and the master clock φR passing through an inverter 9 are inputted to a NOR gate 10 as two inputs and then passed through inverters 11 and 12.

In FIG. 2, a p-type sense amplifier enable clock SAP is initially precharged to half of the internal power supply voltage int. Vcc. That is, when the row address strobe signal $\overline{RAS}$ is at a precharged state of a logic "high" level, the p-type sense amplifier control circuit enable clock φSP becomes at a logic "low" state and the second NMOS transistor 22 is turned ON, whereby the level converting circuit 50B produces an output having the logic "low" state. Thereby, the PMOS transistor 16 of the comparator enable device 50C is turned ON and the output of the comparator 50A is disabled, thus inputting a signal being at the logic "high" state to the trigger circuit 50D. The trigger circuit 50D produces an output having the logic "low" state and the first NMOS transistor 25 is turned OFF, whereby the bias circuit 50E produces an output having the logic "high" state. The p-type sense amplifier driver control circuit 50F produces an output having the logic "high" state and renders the PMOS sense amplifier driver 1 to be turned OFF, whereby the p-type sense amplifier enable signal SAP is precharged to half of the internal power supply voltage int. Vcc.

An explanation of functions and operations of the bias circuit 50E and the p-type sense amplifier driver control circuit 50F will be given in the following.

The bias circuit 50E includes the output line connected to the gate terminal of the second NMOS transistor 29 serving as a driving element of the p-type sense amplifier driver control circuit, thereby making the current iB constant. Namely, Since a voltage at the node N2 increases as the external power supply voltage ext. Vcc increases, the gate-source voltage Vgs of the first NMOS transistor 25 increases to thereby reduce the voltage V. The gate-source voltage Vgs of the second NMOS transistor 29 in the p-type sense amplifier driver circuit 50F decreases, so that the increment of the current iB caused due to the increment of the external power supply voltage ext. Vcc can be prevented. At this time, since the voltage V supplied from the bias circuit 50E is continuously applied to the gate terminal of the second NMOS transistor 29, the second NMOS transistor 29 is not turned OFF at all.

Since the voltage at the node N2 decreases as the external power supply voltage ext. Vcc decreases, the gate-source voltage Vgs of the first NMOS transistor 25 decreases to thereby increase the voltage $V_B$. The gate-source voltage Vgs of the second NMOS transistor 29 in the driver circuit 50F decreases, so that the decrement of the current iB caused due to the decrement of the external power supply voltage ext. Vcc can be prevented. This results in making a drain-source current $I_{DS}$ flowing in the PMOS sense amplifier driver 1 constant. Thereby, the p-type sense amplifier enable signal SAP irrespective of the variation of the external power supply voltage ext. Vcc has a rising tilt.

In the p-type sense amplifier driver control circuit 50F, if the node N2 is at a logic "low" state, the p-type sense amplifier driver enable clock φPSE goes to the logic "high" state to thereby turn OFF the p-type sense amplifier drivers 1 and 5. To the contrary, if the node N2 is at a logic "high" state, the p-type sense amplifier driver enable clock φPSE goes to the logic "low" state to thereby turn ON the p-type sense amplifier drivers 1 and 5 and the first NMOS transistor 28, thus rendering the current iB constant. Even though the external power supply voltage ext. Vcc increases, the current iB is constant thus to maintain a constant voltage of the p-type sense amplifier driver enable clock φPSE. Since the drain-source voltage of the p-type sense amplifier drivers 1 and 5 increases as the external power supply voltage ext. Vcc increases, if a current flowing in the channel is to be constant, the voltage of the p-type sense amplifier driver enable clock φPSE as gate voltages of the p-type sense amplifier drivers 1 and 5 increases to enable a gate source voltage Vgs to be decreased, thereby making a current flowing in the p-type sense amplifier drivers 1 and 5 constant. Accordingly, as a channel current irrespective of the external power supply voltage ext. Vcc is supplied, the rising tilt of the p-type sense amplifier enable clock SAP is all constant in both areas of the "low" external power supply voltage ext. Vcc and the "high" external power supply voltage ext. Vcc, whereby the rising tilt of the p-type sense amplifier enable clock SAP is sharply inclined in the area of the "high" external power supply voltage ext. Vcc. As a result, it is appreciated that the increment of the peak current can be prevented.

An operation of FIG. 2 will be explained hereinafter, when the row address strobe signal $\overline{RAS}$ is at the logic "low" state to thereby designate a row address.

An arbitrary word line is selected by the row address decoding and division of an electric charge is then made between a bit line and a cell. The n-type sense amplifier driver enable clock φNSE is at the logic "high" state to turn ON the NMOS sense amplifier drivers 3 and 7, thus enabling the bit line to be sensed. The p-type sense amplifier control circuit enable clock φSP goes to the logic "high" state and the output node N3 of the level converting circuit 50B reaches the external power supply voltage ext. Vcc to turn OFF the PMOS transistor 16 of the comparator enable device 50C, thereby enabling the output of the comparator 50A. Since the comparator 50A has a reference voltage Vref (4 V) as a higher voltage than that of the p-type sense amplifier enable clock SAP, the comparator 50A enables the output at the node N1 to be at the logic "low" state. Here, the p-type sense amplifier control circuit enable clock φSP is applied to the gate terminal of the third NMOS transistor 15 of the comparator 50A. The trigger circuit 50D detects the node N1 being at the logic "low" state and outputs the node N2 being at the logic "high" state. The output of the trigger circuit 50D being at the logic "high" state enables the bias circuit 50E and the p-type sense amplifier driver control circuit 50F. As previously discussed, as the bias circuit 50E and the driver control circuit 50F operate, the p-type sense amplifier driver enable clock φPSE turns ON the p-type sense amplifier drivers 1 and 5, thereby enabling a voltage of the p-type sense amplifier enable clock SAP to have a constant rising tilt regardless of the change of the external power supply voltage ext. Vcc. Further, if the voltage of the p-type sense amplifier enable clock SAP reaches a potential of 4 V, the gate voltage of the NMOS transistor 13 of the comparator 50A increases, thus enabling the output of the node N1 to be at the logic "high" state, the output of the trigger circuit 50D to be at the logic "low" state, and the output of the bias circuit 50E to become the internal power supply voltage int. Vcc.

Since the first NMOS transistor 28 of the p-type sense amplifier driver control circuit 50F is turned OFF, the p-type sense amplifier driver enable clock φPSE goes to the logic "high" state and the p-type sense amplifier drivers 1 and 5 are turned OFF, thereby prohibiting the voltage of the p-type sense amplifier enable signal SAP from being over 4 V. If the voltage of the p-type sense amplifier enable clock SAP is maintained at a potential of 4 V and then falls below 4 V due to a leakage current of each transistor as a component of the memory cell and sense amplifier, as shown in FIG. 3C, the voltage of the p-type sense amplifier enable signal SAP rises again by the operation of the comparator 50A.

In the conventional sense amplifier control circuit, under the condition that the voltage on the bit line BL is bumped to some extent, the p-type sense amplifier driver 1 of FIG. 2 is slightly turned on and the potential charge of the p-type sense amplifier enable signal SAP flows into the bit line $\overline{BL}$. Hence, the voltage of the p-type sense amplifier enable signal SAP node becomes low and is connected to the gate terminal of the first NMOS transistor 13 of the comparator 50A to thereby turn ON the first NMOS transistor 13. Then, the potential at the node N1 is at the logic "low" state and the voltage of the p-type sense amplifier enable signal SAP can be recovered again.

However, under the condition that damage of the voltage on the bit line BL is large generated, the p-type sense amplifier driver 1 of FIG. 2 is slightly turned 0N and the voltage of the p-type sense amplifier enable signal SAP node drops due to the bit line $\overline{BL}$. However, the sense amplifier control circuit of FIG. 2 does not have a structure capable of achieving the rapid recovery of the p-type sense amplifier enable signal SAP, so that a slow recovery capability of the bit line BL and the bit line $\overline{BL}$ appears. As a result, this causes the restoring time of the memory cell to be reduced, thus making it impossible to completely recover cell data. Specially, this seriously appears upon data transmission of a dual port memory.

SUMMARY OF THE INVENTION

Therefore, an object of the present invention is to provide a sense amplifier control circuit which can improve an active restoring capability of cell by rapidly recovering a bit line while data transmission is made from a RAM to a SAM or another port.

According to an aspect of the present invention, there is provided a semiconductor memory device having a sense amplifier operated by a given control signal and a first sense amplifier driver. Included is a p-type sense amplifier driver control circuit having an output line connected to a control terminal of the first sense amplifier driver for variably controlling the current flowing into the first sense amplifier driver, by allowing the amount of current to be increased when transmitting data from a RAM port to a SAM port. A bias circuit 50E having an output line connected to a control terminal of the driving element of the p-type sense amplifier driver control circuit maintain the current flowing into the driving element at a constant state regardless of the increment or decrement of an external power supply voltage. Further, a drive device having an input line connected to a voltage applied to the sense amplifier and an output line connected to the input lines of the p-type sense amplifier driver control circuit and the bias circuit drives the p-type sense amplifier driver control circuit and the bias circuit.

BRIEF DESCRIPTION OF THE DRAWINGS

The following is a detailed description of this invention by the reference of the attached drawings, in which like numbers indicate the same or similar elements.

DETAILED DESCRIPTION OF THE PREFERRED EMBODIMENTS

Figure 4:
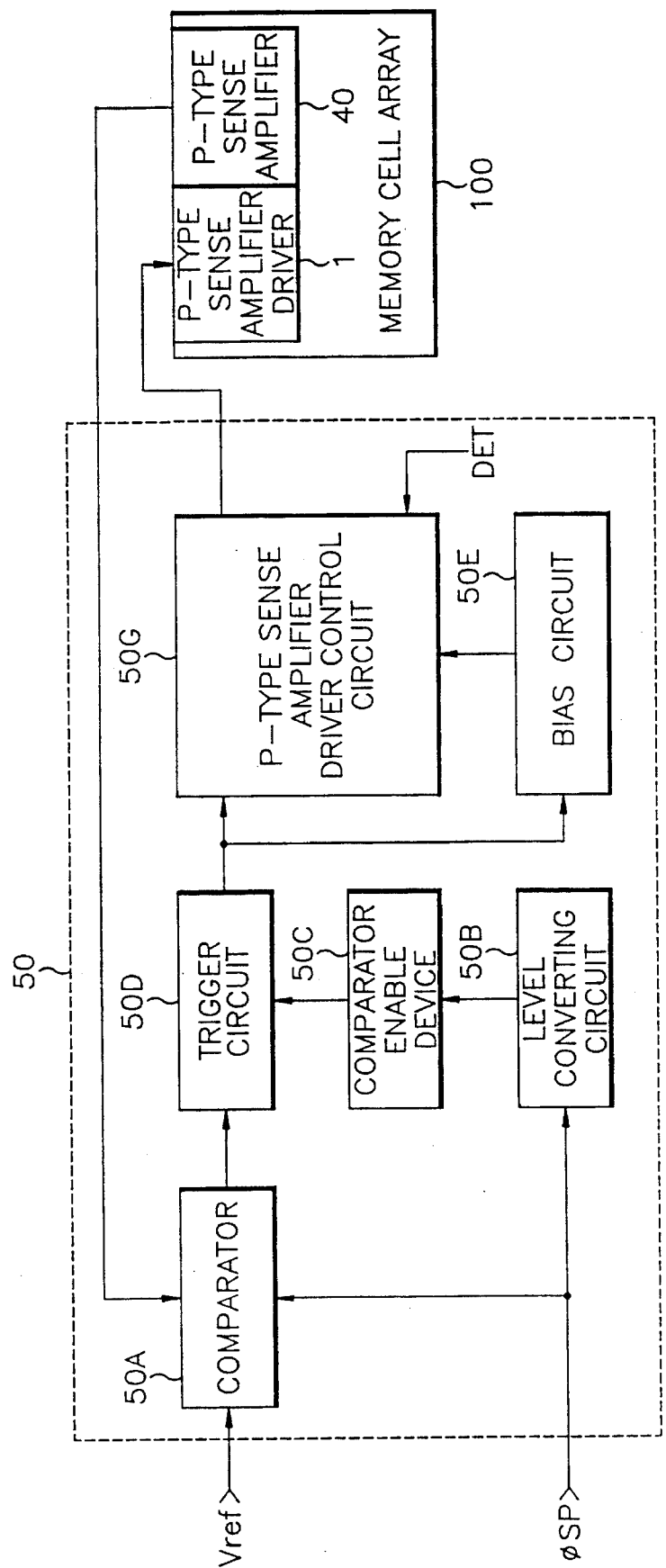
FIG. 4 is a functional block diagram illustrating a sense amplifier control circuit according to the present invention.

FIG. 4 is a functional block diagram illustrating a sense amplifier control circuit classified in accordance with the present invention.

A sense amplifier control circuit 50 according to the present invention is comprised of a comparator 50A, a trigger circuit 50D, a level converting circuit 50B, a comparator enable device 50C, a bias circuit 50E, and a p-type sense amplifier driver control circuit 50G. Circuit 50A–50E provide a feedback circuit which allows the sense amplifier control circuit 50G to maintain a constant circuit flow output to the drive transistor.

The comparator 50A inputs and compares a voltage of the p-type sense amplifier 40 of a memory cell array 100 and a reference voltage Vref and outputs the compared voltage by the control of a p-type sense amplifier control circuit enable signal φSP.

The level converting circuit 50B converts a second power supply voltage of the p-type sense amplifier control circuit enable signal φSP into a first power supply voltage. Typically, the first power supply voltage is an external power supply voltage having a potential of 5 V, and the second power supply voltage is an internal power supply voltage having a potential of 4 V.

The comparator enable device 50C enables or disables the output of the comparator 50A through the level converting circuit 50B.

The trigger circuit 50D inputs, inverts and outputs the outputs of the comparator 50A and comparator enable device 50C.

The bias circuit 50E inputs the output of the trigger circuit 50D and controls that a current flowing to a driving element of the p-type sense amplifier driver control circuit 50G is constant.

The p-type sense amplifier driver control circuit 50G inputs the outputs of the trigger circuit 50D and bias circuit 50E, outputs them to a gate terminal of a p-type sense amplifier driver 1, and then make a flow of current of the p-type sense amplifier driver 1 constant. More particularly, upon data transmission of a dual port memory, under the condition that the voltage on a bit line BL is heavily damaged, the p-type sense amplifier driver control circuit 50G increases current flow through the p-type sense amplifier driver 1 to a level greater than the current during the normal operation, and the p-type sense amplifier enable signal SAP can be rapidly recovered. That is, the p-type sense amplifier driver control circuit 50G can variably control the current flowing into the p-type sense amplifier driver 1, by allowing the amount of current to be increased in case of transmitting data of the RAM port to the SAM port, rather than case of sensing the RAM port.

Figure 5:
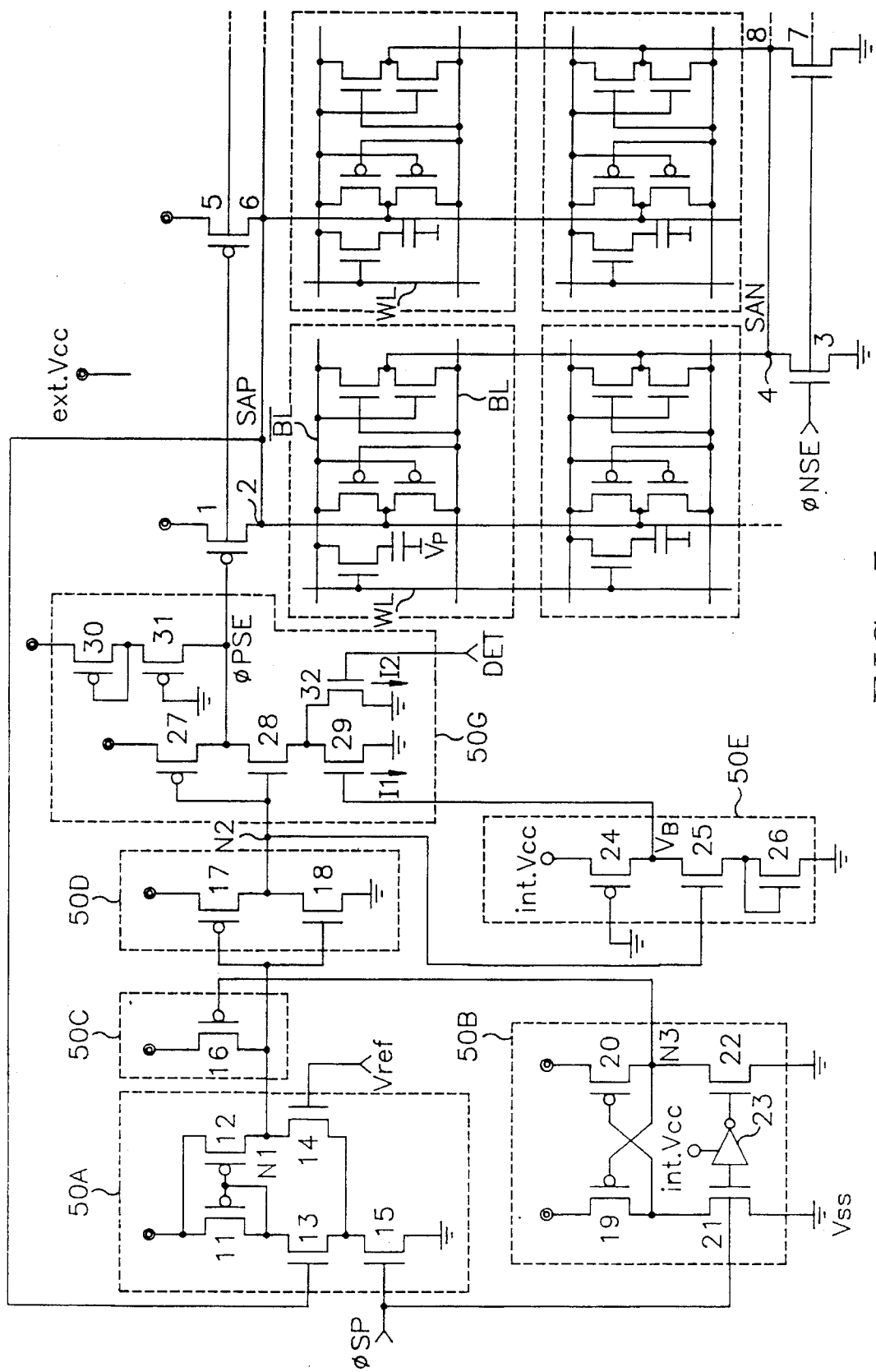
FIG. 5 is a detailed circuit diagram illustrating the sense amplifier control circuit of FIG. 4.
Figure 6:
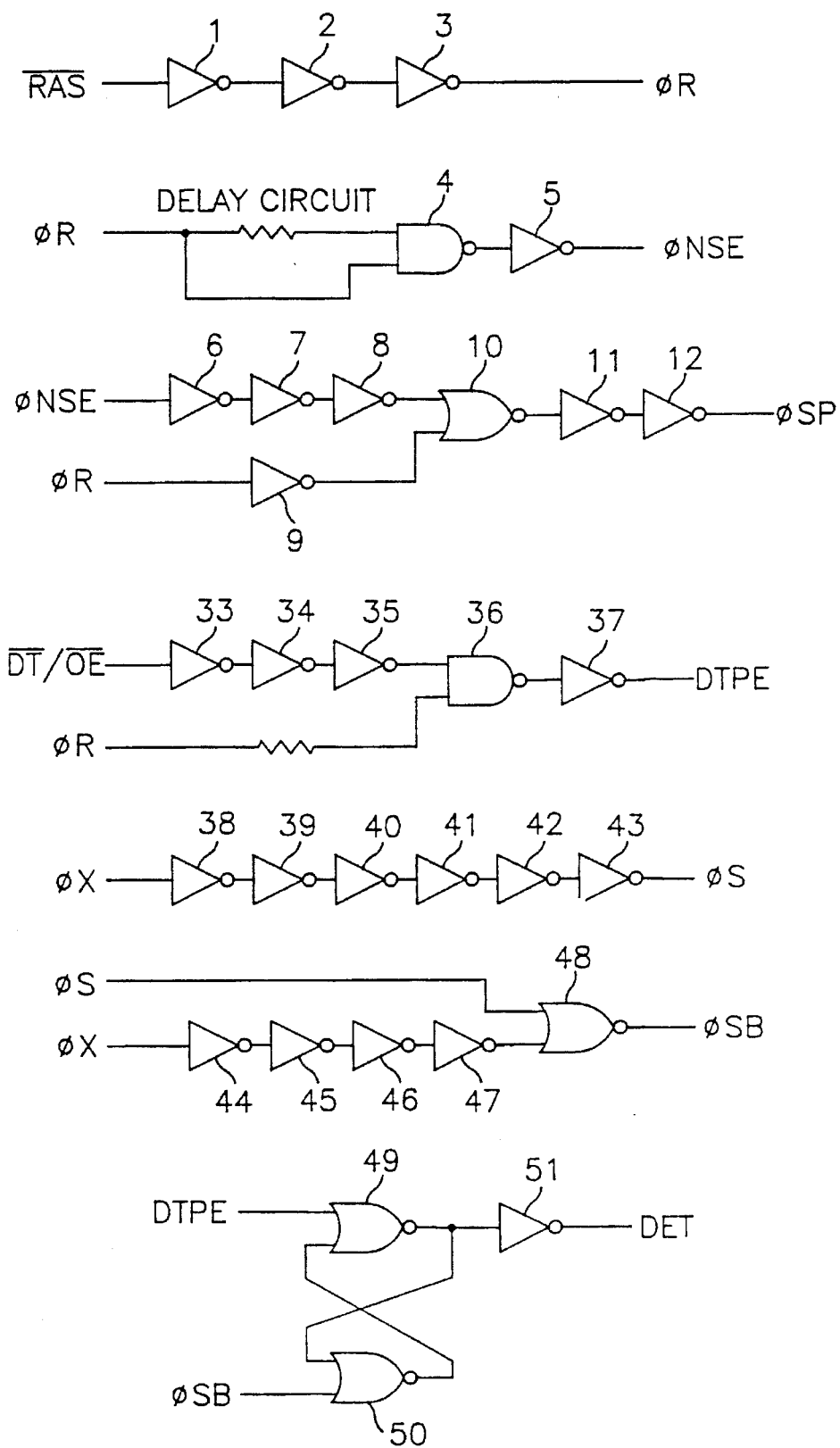
FIG. 6 is a diagram illustrating a circuit for generating a clock signal of the FIG. 5 circuit.
Figure 7:
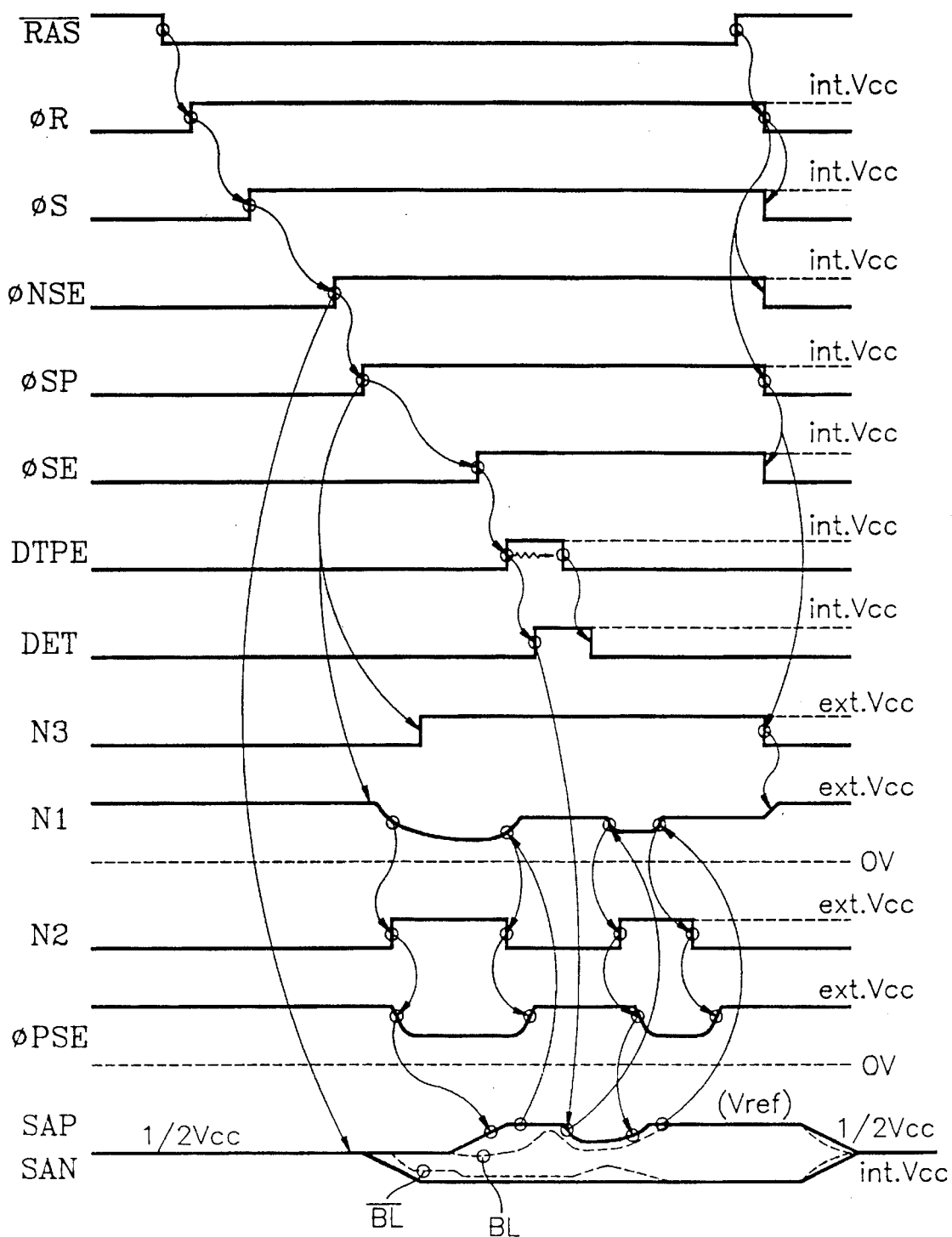
FIGS. 7 and 8 are timing diagrams illustrating operation of the FIG. 5 circuit.
Figure 8:
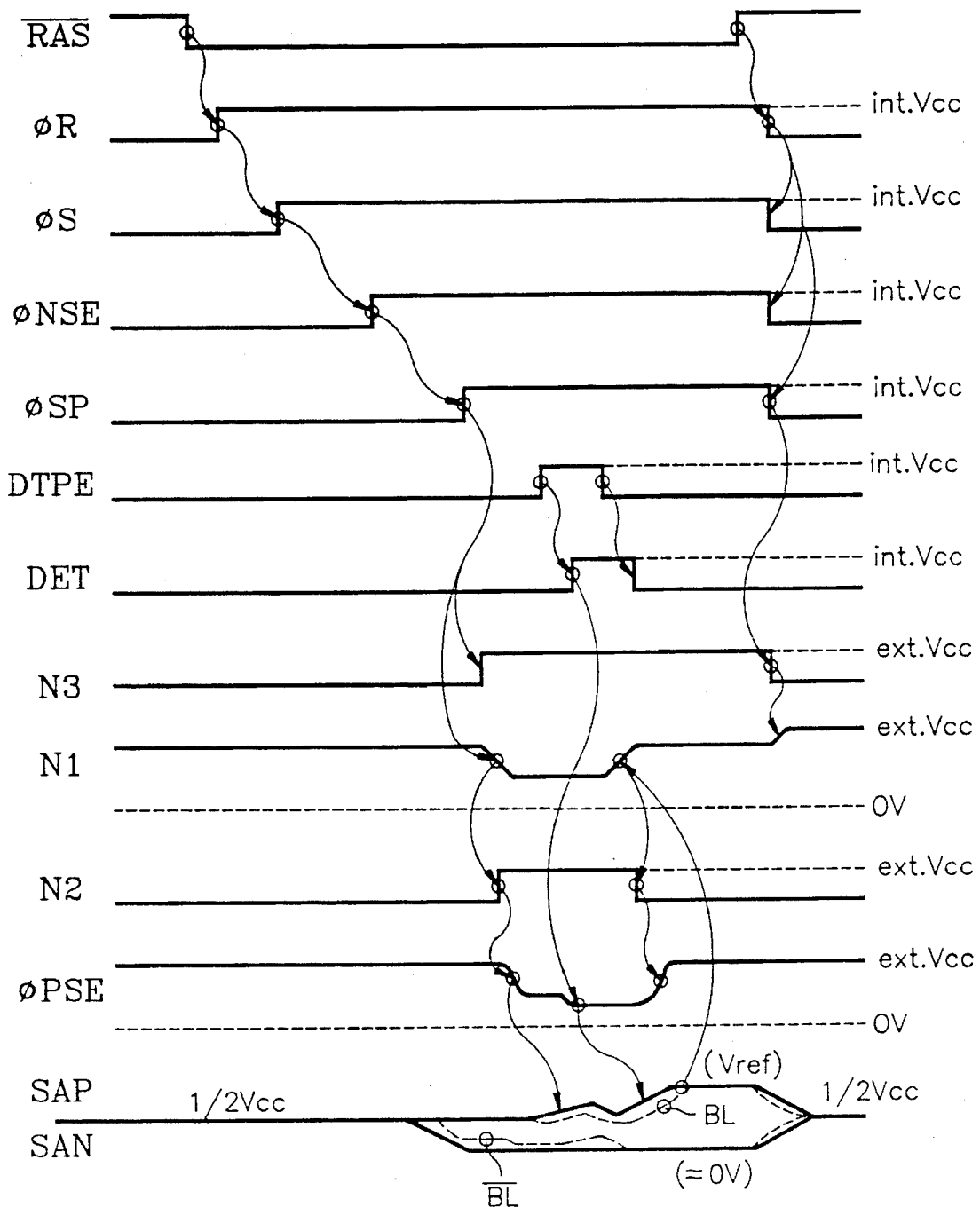

FIG. 5 is a detailed circuit diagram illustrating the conventional sense amplifier control circuit of FIG. 4, FIG. 6 is a diagram illustrating a circuit for generating a clock signal of FIG. 5, and FIGS. 7 and 8 are timing diagrams illustrating an operation of FIG. 5.

Figure 1:
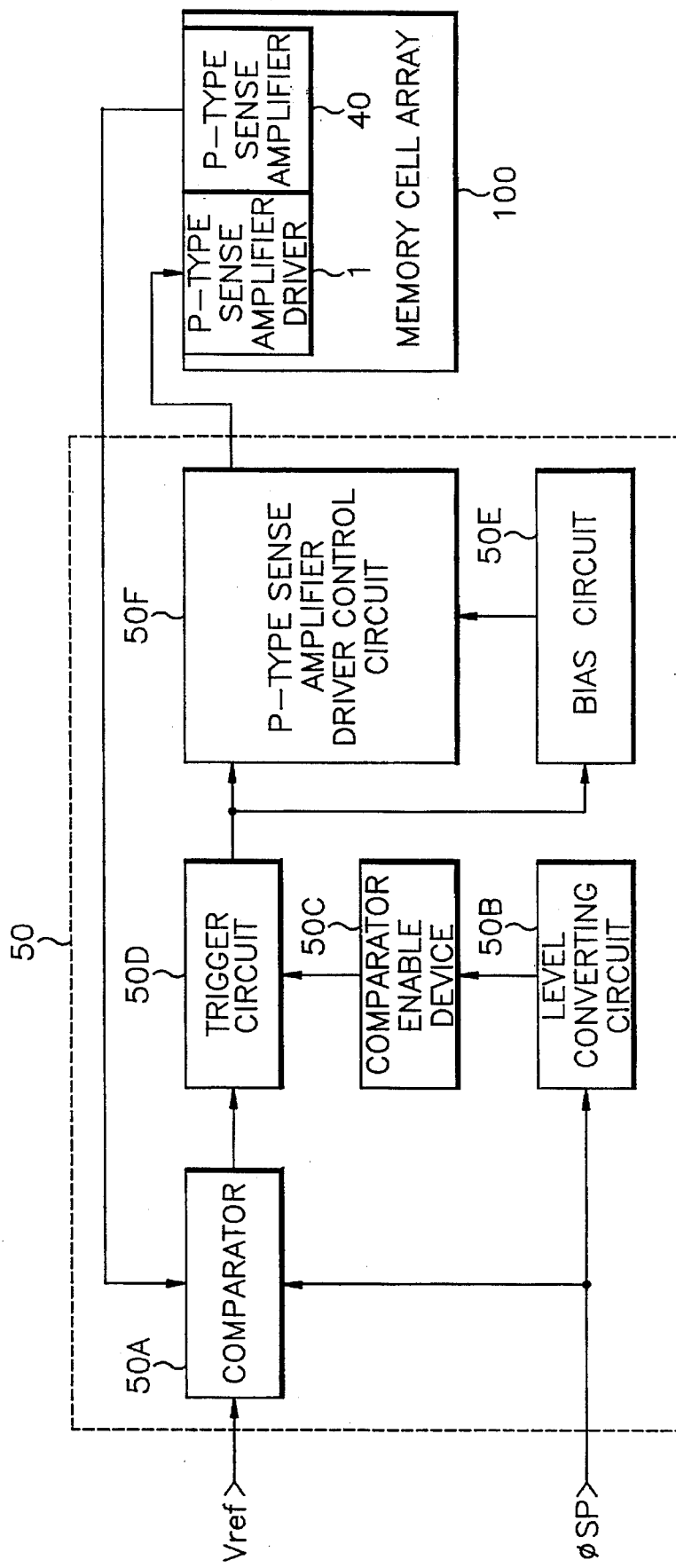
FIG. 1 is a functional block diagram illustrating a conventional sense amplifier control circuit.
Figure 2:
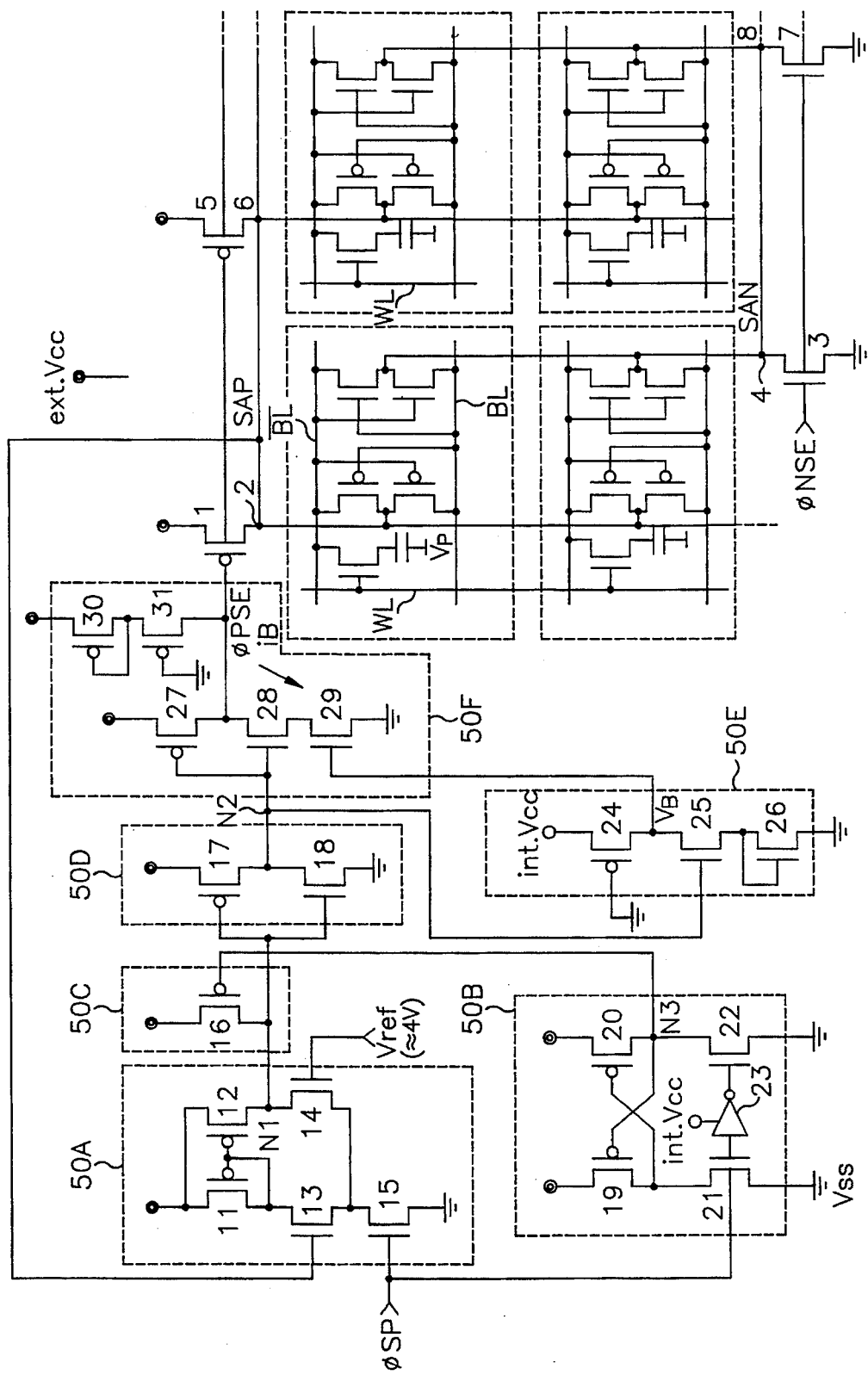
FIG. 2 is a detailed circuit diagram illustrating the conventional sense amplifier control circuit of FIG. 1.

Referring to FIG. 5, since the configurations of comparator 50A, level converting circuit 50B, comparator enable device 50C, trigger circuit 50D, and bias circuit 50E are the same as those of the conventional sense amplifier control circuit as shown in FIG. 2, explanations of these circuits will not be repeated;

The p-type sense amplifier driver control circuit 50G is comprised of a PMOS transistor 27 having a source terminal connected to an external power supply voltage and a gate terminal connected to the output node of the trigger circuit 50D, a first NMOS transistor 28 having a gate terminal connected to a first input line, an output line connecting a common terminal of the PMOS and first NMOS transistors 27 and 28 to a control terminal of the sense amplifier driver 1 and generating a p-type sense amplifier driver enable clock φSPE, a second NMOS transistor 29 having a drain terminal and a source terminal connected between the source terminal of the first NMOS transistor 28 and a ground potential terminal, and having a gate terminal connected to the output node of the bias circuit 50E, a third NMOS transistor 32 connected between the drain terminal of the second NMOS transistor 29 and a ground potential, and having a gate terminal connected to a sensing clock DET generated in correspondence to the data transmission of the RAM port to the SAM port, and a device for controlling currents I1 and I2 flowing through the first, second and third NMOS transistors 28, 29, and 32, under a specific condition. The device for controlling currents I1 and I2 is comprised of a first PMOS transistor 30 having a source terminal connected to an external power supply voltage terminal and gate and drain terminals diode-connected to each other, and a second PMOS transistor 31 having both terminals connected between the drain terminal of the first PMOS transistor 30 and the output line, and a gate terminal connected to a ground potential terminal. The external power supply voltage terminal outputs an external power supply voltage ext. Vcc, and the internal power supply voltage terminal outputs an internal power supply voltage int. Vcc.

Under the above-mentioned configuration, constant current flowing is established in the first and second NMOS transistors 28 and 29 in the same manner is the conventional art, but when executing data transmission showing that the recovery of the voltage on the bit line BL is slow due to the heavy damage thereof and a sensing operation of the voltage on the bit line BL is not sufficiently performed, the current I1 flowing through the first and second NMOS transistors 28 and 29 and the current I2 flowing through the first and third NMOS transistors 28 and 32 are added to each other, thus enabling a response time of the p-type sense amplifier driver control circuit 50G to be more rapid. Further, the current flowing through the p-type sense amplifier driver 1 can be increased and the voltage of the p-type sense amplifier enable signal SAP can be rapidly made as a reference voltage to thereby sufficiently recover the voltage on the bit line BL.

A description of the sense amplifier control circuit of FIG. 5 will be made with reference to FIGS. 6 to 8. An n-type sense amplifier driver enable clock φNSE is generated after a signal φS passing through a delay circuit and a master clock φR are passed through a NAND gate 4. The master clock φR is generated by a row address strobe signal $\overline{RAS}$ that is passed through inverters 1 to 3, as shown in FIG. 6.

The p-type sense amplifier control circuit enable clock φSP is generated after the n-type sense amplifier driver enable clock φNSE passing through inverters 6 to 8 and the master clock φR passing through an inverter 9 are inputted to a NOR gate 10 as two inputs and then passed through inverters 11 and 12.

A data transmission enable clock DTPE for transmitting RAM data to the SAM delays master clocks $\overline{DT/OE}$ through the inverters 33 to 35, delays the master clock φR through a delay circuit, and is then generated through a NAND gate 36 and an inverter 37. Also, a clock φSB for enabling a sensing signal DET in a sensing window delays a word line enable clock φX through a sensing enable clock φS and inverters 44 to 47 and is then generated through a NOR gate 48. The sensing signal DET inputs the data transmission enable clock DTPE and the clock φSB and is then generated through NAND gates 49 and 50 and an inverter 51.

In FIG. 5, a p-type sense amplifier enable clock SAP is initially precharged to half of the internal power supply voltage int. Vcc. That is, when the row address strobe signal $\overline{RAS}$ is at a precharged state of a logic "high" level, the p-type sense amplifier control circuit enable clock φSP becomes at the logic "low" state and the second NMOS transistor 22 is turned ON, whereby the level converting circuit 50B produces an output having the logic "low" state. Thereby, the PMOS transistor 16 of the comparator enable device 50C is turned ON and the output of the comparator 50A is disabled, thus inputting a signal being at the logic "high" state to the trigger circuit 50D. The trigger circuit 50D produces an output having the logic "low" state and the first NMOS transistor 25 is turned OFF, whereby the bias circuit 50E produces an output having the logic "high" state. The p-type sense amplifier driver control circuit 50F produces an output having the logic "high" state and renders the PMOS sense amplifier driver 1 to be turned OFF, whereby the p-type sense amplifier enable signal SAP is precharged to half of the internal power supply voltage int. Vcc.

An explanation of functions and operations of the bias circuit 50E and the p-type sense amplifier driver control circuit 50G will be given in the following.

The bias circuit 50E includes the output line connected to the gate terminal of the second NMOS transistor 29 serving as a driving element of the p-type sense amplifier driver control circuit 50G, thereby making the current I1 constant. Namely, since a voltage at the node N2 increases as the external power supply voltage ext. Vcc increases, the gate-source voltage Vgs of the first NMOS transistor 25 of the bias circuit 50E increases to thereby reduce the voltage $V_B$. The gate-source voltage Vgs of the second NMOS transistor 29 in the driver circuit 50G decreases, so that the increment of the current I1 caused due to the increment of the external power supply voltage ext. Vcc can be prevented. At this time, since the voltage $V_B$ supplied from the bias circuit 50E is continuously applied to the gate terminal of the second NMOS transistor 29, the second NMOS transistor 29 is not turned OFF at all.

Since the voltage at the node N2 decreases as the external power supply voltage ext. Vcc decreases, the gate-source voltage Vgs of the first NMOS transistor 25 of the bias circuit 50E decreases to thereby increase the voltage $V_B$. The gate-source voltage Vgs of the second NMOS transistor 29 in the p-type sense amplifier driver circuit 50G decreases, so that the decrement of the current I1 caused due to the decrement of the external power supply voltage ext. Vcc can be prevented. This results in making a drain-source current $I_{DS}$ flowing in the PMOS sense amplifier driver 1 constant. Thereby, the p-type sense amplifier enable signal SAP irrespective of the variation of the external power supply voltage ext. Vcc has a rising tilt.

The third NMOS transistor 32 is connected parallel to the second NMOS transistor 29 and the gate terminal of the third NMOS transistor 32 is connected to the sensing signal DET. Thus, while transmitting the RAM port data to the SAM port, in case that the voltage on the bit lines BL and $\overline{BL}$ of the RAM is greatly damaged, the currents I1 and I2 flowing through the p-type sense amplifier driver control circuit 50G are added to each other and a potential of the p-type sense amplifier driver enable clock φPSE is lowered. Then, the potential of the p-type sense amplifier enable signal SAP node is rapidly raised to the reference voltage Vref level, thereby improving the recovery capability of the voltage on the bit line BL and further having an active restoring ability.

When performing data transmission as maintaining the sensing enable clock φS at the logic "high" state, the sensing signal DET is enabled to the logic "high" state.

An operation of FIG. 5 will be explained hereinafter, when the row address strobe signal $\overline{RAS}$ is at the logic "low" state to thereby designate the row address.

An arbitrary word line is selected by the row address decoding and division of an electric charge is then made between a bit line and a cell. The n-type sense amplifier driver enable clock φNSE is at the logic "high" state to turn ON the NMOS sense amplifier driver 3 and 7, thus enabling the voltage on the bit line to be sensed. The p-type sense amplifier control circuit enable clock φSP goes to the logic "high" state and the output node N3 of the level converting circuit 50B reaches the external power supply voltage ext. Vcc to turn OFF the PMOS transistor 16 of the comparator enable device 50C, thereby enabling the output of the comparator 50A. Since the comparator 50A has a higher reference voltage Vref than that of the p-type sense amplifier enable clock SAP, the comparator 50A enables the output at the node N1 to be at the logic "low" state. Here, the p-type sense amplifier control circuit enable clock φSP is applied to the gate terminal of the third NMOS transistor 15 of the comparator 50A. The trigger circuit 50D detects the node N1 being at the logic "low" state and outputs the node N2 being at the logic "high" state. The output of the trigger circuit 50D being at the logic "high" state enables the bias circuit 50E and the p-type sense amplifier driver control circuit 50G. As previously discussed, as the bias circuit 50E and the driver control circuit 50G operate, the p-type sense amplifier driver enable clock φPSE make the p-type sense amplifier drivers 1 and 5 turn ON, thereby enabling a voltage of the p-type sense amplifier enable clock SAP to have a constant rising tilt regardless of the change of the external power supply voltage ext. Vcc. Further, if the voltage of the p-type sense amplifier enable clock SAP reaches the reference voltage Vref, the gate voltage of the NMOS transistor 13 of the comparator 50A increases, thus enabling the output of the node N1 to be at the logic "high" state, the output of the trigger circuit 50D to be at the logic "low" state, and the output of the bias circuit 50E to become the internal power supply voltage int. Vcc.

Figure 3A:
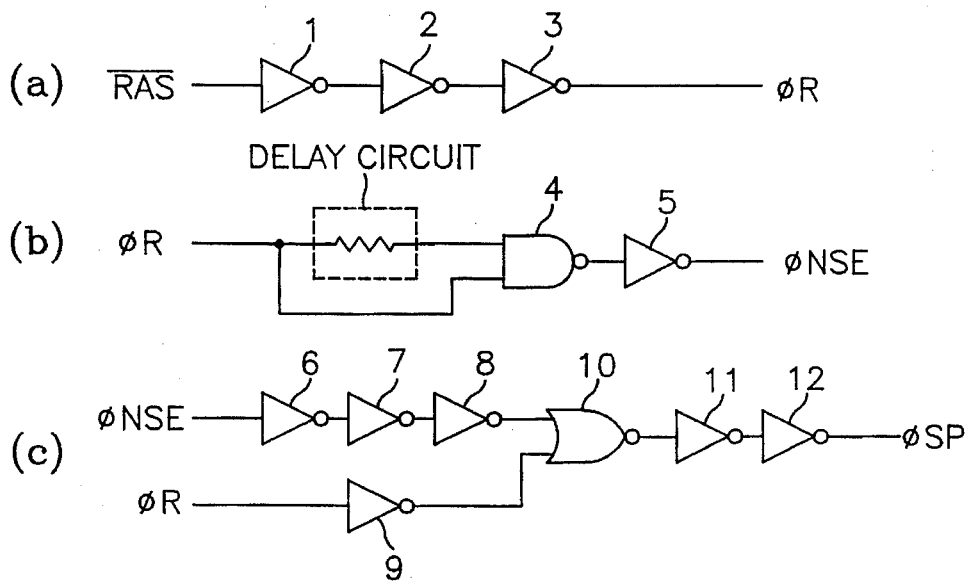
FIG. 3A is a diagram illustrating a circuit for generating a clock signal of FIG. 2.
Figure 3C:
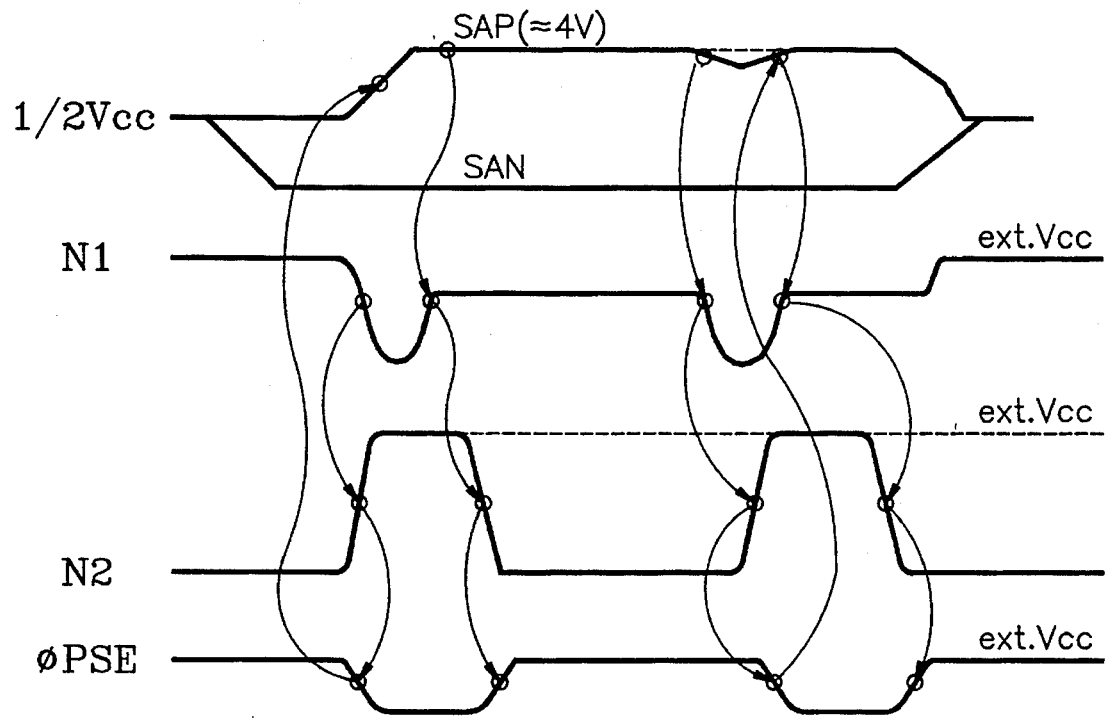
FIG. 3C is a detailed timing diagram further illustrating operation of a portion of the FIG. 2 circuit.
Figure 3B:
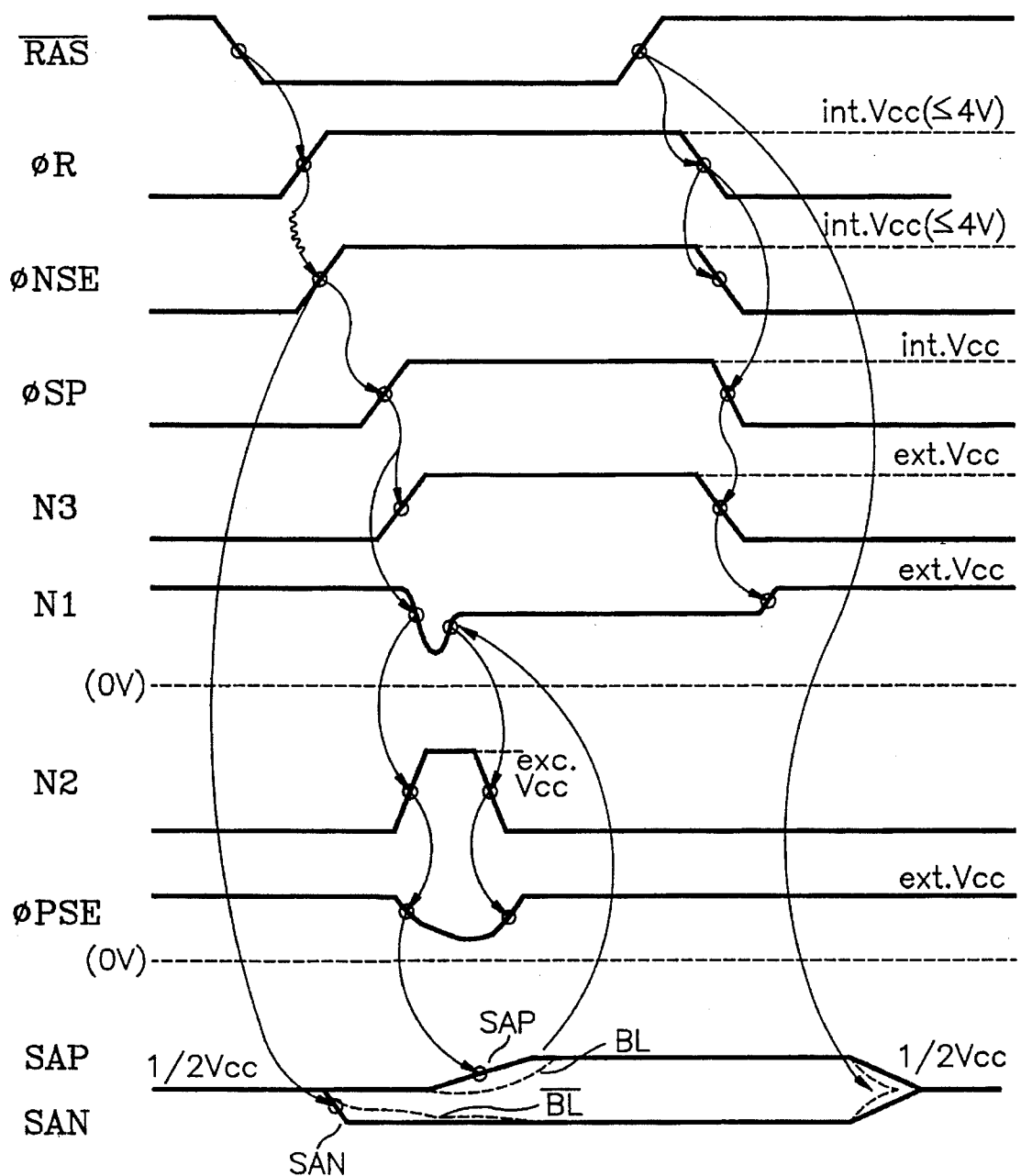
FIG. 3B is a timing diagram illustrating operation of the FIG. 2 circuit.

Since the first NMOS transistor 28 of the p-type sense amplifier driver control circuit 50F is turned OFF, the p-type sense amplifier driver enable clock φPSE goes to the logic "high" state and the p-type sense amplifier drivers 1 and 5 are turned OFF, thereby prohibiting the voltage of the p-type sense amplifier enable signal SAP from being over the reference voltage Vref. If the voltage of the p-type sense amplifier enable clock SAP is maintained at a potential of the reference voltage Vref and then falls below 4 V due to a leakage current of each transistor as a component of the memory cell and sense amplifier, as shown in FIG. 3C, the voltage of the p-type sense amplifier enable signal SAP rises again by the operation of the comparator 50A.

A detailed description of data transmission operations will be given with reference to FIGS. 7 and 8. FIG. 7 is a timing diagram showing the data transmission enable clock DTPE enabled by the master clock φR and FIG. 8 is a timing diagram showing the data transmission enable clock DTPE enabled by the master clock $\overline{DT/OE}$ which synchronizes a data transmission. In these figures, before the data transmission enable clock DTPE is enabled, the voltage on the bit lines BL and $\overline{BL}$ starts to perform a sensing operation, as described above. At this time, if the data transmission enable dock DTPE is enabled, the bit fines BL and $\overline{BL}$ shares a charge with a port where data is transmitted, for example, a bit line of SAM, to thereby greatly damage the voltage on the bit line of RAM. At this time, the data transmission enable clock DTPE enables the sensing signal DET and turns ON the third NMOS transistor 32 of the p-type sense amplifier driver control circuit 50G of FIG. 5. Thereafter, the voltage of the p-type sense amplifier driver enable clock φPSE is sufficiently enabled to the logic "low" state, and the p-type sense amplifier driver 1 is fully turned ON. As a result, the voltage of the p-type sense amplifier enable clock SAP is raised to the reference voltage Vref and the voltage on the bit line BL can be rapidly sensed up to the reference voltage Vref.

As can be appreciated from the above description, there is provided a sense amplifier control circuit according to the present invention which can improve an active restoring capability of cell by rapidly recovering a voltage on the bit line while data transmission is made from a RAM to a SAM or another port.

What is claimed is:

1. A semiconductor memory device having a sense amplifier operated by a given control signal and a first sense amplifier driver, said semiconductor memory device comprising:

a sense amplifier driver control circuit having an output line connected to a control terminal of said first sense amplifier driver for variably controlling current flow into said first sense amplifier driver by providing a driving element having a plurality of current paths for increased current flow when transmitting data of a RAM port to a SAM port;

a bias circuit having an output line connected to a control terminal of said driving element of said sense amplifier driver control circuit which assists in maintaining said current flowing into said driving element at a constant rate regardless of an increment or decrement of an external power supply voltage; and means having an input line connected to a voltage applied to said sense amplifier and an output line connected to an input line of said sense amplifier driver control circuit and an input line of said bias circuit to drive said sense amplifier driver control circuit and said bias circuit.

2. The semiconductor memory device as claimed in claim 1, wherein said first sense amplifier driver is comprised of a PMOS transistor.

3. The semiconductor memory device as claimed in claim 1, wherein said sense amplifier driver control circuit comprises:

a PMOS transistor having a source terminal connected to a first power supply voltage terminal and a gate terminal connected to a first input line;

a first NMOS transistor having a gate terminal connected to said first input line;

an output line connecting a common terminal of said PMOS and first NMOS transistors to a control terminal of said sense amplifier driver;

a second NMOS transistor having a drain terminal and a source terminal connected to the source terminal of said first NMOS transistor and a ground potential terminal, and having a gate terminal connected to a second input line;

a third NMOS transistor having source and drain terminals connected between the drain terminal of said first NMOS transistor and a ground potential terminal and having a gate terminal connected to a sensing signal generated in correspondence with data transmission of said RAM port to said SAM port; and means connected between said first power supply voltage terminal and said output line, for controlling currents flowing through said first, second and third NMOS transistors.

4. The semiconductor memory device as claimed in claim 3, wherein said means comprises a first PMOS transistor having a source terminal connected to a first power supply voltage terminal and gate and drain terminals diode-connected to each other, and a second PMOS transistor having both terminals connected between the drain terminal of said first PMOS transistor and the output line and having a gate terminal connected to a ground potential terminal.

5. The semiconductor memory device as claimed in claim 3, wherein said first power supply voltage terminal is an external power supply voltage terminal having a first level.

6. The semiconductor memory device as claimed in claim 1, wherein said bias circuit comprises:

a PMOS transistor having a source terminal connected to a second power supply voltage terminal and a gate terminal connected to a ground potential terminal;

a first NMOS transistor having a drain terminal connected to the drain terminal of said PMOS transistor and a gate terminal connected to an input line;

an output node for connecting a common terminal of said PMOS and first NMOS transistors to a second input line of said sense amplifier driver control circuit; and a second NMOS transistor having drain and gate terminals diode-connected to the source terminal of said first NMOS transistor and a source terminal connected to a ground potential terminal.

7. The semiconductor memory device as claimed in claim 1, wherein said second power supply voltage terminal is an internal power supply voltage terminal having a second level.

8. The semiconductor memory device as claimed in claim 1, wherein said means comprises:

a comparator having a first input line connected to a first sense amplifier enable node which is connected to one terminal of said first sense amplifier driver, a second input line to which a predetermined reference voltage is applied, a third input line to which a predetermined clock signal is applied, and an output node; and a trigger circuit having an input node connected to the output node of said comparator and an output node connected commonly to the input line of said bias circuit and a first input line of said sense amplifier driver control circuit.

9. The semiconductor memory device as claimed in claim 8, wherein said predetermined reference voltage is an internal power supply voltage.

10. The semiconductor memory device as claimed in claim 8, wherein said predetermined clock signal is generated after a second sense amplifier driver is driven.

11. The semiconductor memory device as claimed in claim 10, wherein said second sense amplifier driver is an NMOS sense amplifier driver.

12. The semiconductor memory device as claimed in claim 8, wherein said comparator comprises:

a first PMOS transistor having a source terminal connected to a first power supply voltage terminal and a gate terminal and a drain terminal are diode-connected to each other;

a second PMOS transistor having a source terminal connected to the first power supply voltage terminal and a gate terminal connected to the gate terminal of said first PMOS transistor;

a first NMOS transistor having a gate terminal connected to the first input line and a drain terminal connected to the drain terminal of said first PMOS transistor;

a second NMOS transistor having a gate terminal connected to the second input line and a drain terminal connected to the drain terminal of said second PMOS transistor;

an output node connected to a common terminal between said second PMOS and NMOS transistors; and a third NMOS transistor having a drain terminal connected to each of source terminals of said first and second NMOS transistors, a gate terminal connected to the third input line, and a source terminal connected to a ground potential terminal.

13. The semiconductor memory device as claimed in claim 8, wherein said trigger circuit comprises:

a PMOS transistor having a source terminal connected to a first power supply voltage terminal and a gate terminal connected to the input node;

an NMOS transistor having a source terminal connected to a ground potential terminal and a gate terminal connected to the input node; and an output node connected commonly to each of drain terminals of said PMOS and NMOS transistors.

14. The semiconductor memory device as claimed in claim 4, wherein said first power supply voltage terminal is an external power supply voltage terminal having a first level.

15. The semiconductor memory device as claimed in claim 1 wherein said second current path is obtained using a sensing signal which is generated when said data transmission occurs.

16. The semiconductor memory device as claimed in claim 1 wherein said plurality of current paths in said driver element include a first current path controlled by said control terminal connected to said output line of said bias circuit and a second current path controlled by a second control terminal which receives a sensing signal which is generated when said data transmission occurs.

17. A semiconductor memory device comprising:

a sense amplifier driver having a control terminal and a sense amplifier driver output;

a sense amplifier driver control circuit having an input line and an output line, said output line connected to said control terminal of said sense amplifier driver, said sense amplifier driver control circuit variably controlling a first current flow into said sense amplifier driver so that said first current flow can be increased during a data transmission, said sense amplifier driver control circuit including a driving element having a current path and a control terminal, said control terminal controlled by a sensing signal which is generated when said data transmission occurs to allow for an increased second current flow through said current path when transmitting data to assist in obtaining said increase in said first current flow; and a feedback circuit having an input connected to said sense amplifier driver output and an output connected to said input line of said sense amplifier driver control circuit.

18. A semiconductor memory device as claimed in claim 17 wherein:

said driving element of said sense amplifier driver control circuit includes a second current path and a second control terminal; and said feedback circuit includes:

a comparator which compares a driver signal which exists on said sense amplifier driver output with a reference signal to obtain a comparator output signal at a comparator output, said comparator output being coupled to said input line of said sense amplifier driver control circuit; and a bias circuit having an bias circuit input line coupled to said comparator output and a bias circuit output line connected to said second control terminal of said driving element of said sense amplifier driver control circuit to assist in maintaining said current flowing into said driving element at said constant rate regardless of said increment or decrement of said external power supply voltage.

19. A semiconductor memory device as claimed in claim 18 wherein said data transmission transmits data from a RAM port to a SAM port.

* * * * *